(12) United States Patent
Lesso et al.

(10) Patent No.: US 10,375,493 B2
(45) Date of Patent: Aug. 6, 2019

(54) AUDIO TEST MODE

(71) Applicant: Cirrus Logic International Semiconductor Ltd., Edinburgh (GB)

(72) Inventors: John Paul Lesso, Edinburgh (GB); Yanto Suryono, Tokyo (JP)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/009,638

(22) Filed: Jun. 15, 2018

(65) Prior Publication Data

US 2018/0367929 A1 Dec. 20, 2018

Related U.S. Application Data

(60) Provisional application No. 62/521,627, filed on Jun. 19, 2017.

(30) Foreign Application Priority Data

Aug. 25, 2017 (GB) .................................. 1713701.9

(51) Int. Cl.
*H04R 29/00* (2006.01)
*H04R 3/04* (2006.01)
*G10L 19/12* (2013.01)
*G01R 31/3167* (2006.01)
*G10L 19/04* (2013.01)

(52) U.S. Cl.
CPC ....... *H04R 29/001* (2013.01); *G01R 31/3167* (2013.01); *G10L 19/12* (2013.01); *H04R 3/04* (2013.01); *H04R 29/00* (2013.01); *G10L 19/04* (2013.01); *H04R 2430/03* (2013.01)

(58) Field of Classification Search
CPC ........ H04R 29/001; H04R 3/04; H04R 29/00; H04R 29/004; H04R 29/007; H04R 2430/03; G10L 19/12; G10L 19/04; G01R 31/3167

See application file for complete search history.

(56) References Cited

U.S. PATENT DOCUMENTS

| | | |
|---|---|---|
| 5,680,508 A | 10/1997 | Liu |
| 2002/0075965 A1 | 6/2002 | Claesson et al. |
| 2009/0257579 A1 | 10/2009 | Takada |
| 2010/0158273 A1* | 6/2010 | Cheah .................... H03G 9/025 381/102 |
| 2011/0103573 A1 | 5/2011 | Susan |

(Continued)

OTHER PUBLICATIONS

International Search Report and Written Opinion of the International Searching Authority, International Application No. PCT/GB2018/051577, dated Aug. 14, 2018.

(Continued)

*Primary Examiner* — Jason R Kurr
(74) *Attorney, Agent, or Firm* — Jackson Walker L.L.P.

(57) ABSTRACT

An audio system receives an input signal and, if the input signal has a sparse representation in the frequency domain, comprising components at at least one frequency of interest, the input signal is filtered in at least one band pass filter, such that only components at the or each frequency of interest are passed to an output. The operation is able in some case to analyze the input signal to determine whether the input signal has a sparse representation in the frequency domain.

20 Claims, 8 Drawing Sheets

(56) References Cited

U.S. PATENT DOCUMENTS

2014/0355774 A1  12/2014  Quan

OTHER PUBLICATIONS

Combined Search and Examination Report, UKIPO, Application No. GB1713701.9, dated Jan. 19, 2018.
Plumbley et al., "Sparse Representations in Audio and Music: From Coding to Source Separation", Proceedings of IEEE, vol. 98, Issue 6, Jun. 2010, pp. 995-1005.

* cited by examiner

AUDIO TEST MODE

FIELD OF THE INVENTION

This relates to an audio system having a specific test mode.

BACKGROUND

It is desirable to be able to test an audio system. For example, when an audio system is implemented on a mobile device such as a smartphone, it is useful for the manufacturer of the smartphone to be able to test the operation of the audio system. Also, it is common for third parties to test the audio systems on smartphones, in order to make comparisons between models.

However, such tests most commonly use an audio system that is provided as part of the operating system of the device. This audio system may be unable to recognise the full capabilities of the audio system. For example, smartphones or other mobile devices may contain components such as high quality digital-to-analog converters (DACs) that are able to handle a wide dynamic range. However, smartphones or other mobile devices using the Android operating system use the AudioFlinger audio system. The AudioFlinger system operates with 16 bit data at a frequency of 48 kHz, and so it is inherently limited to a 96 dB dynamic range. Thus, a test that uses the AudioFlinger audio system would never be able to recognise the full capabilities of the audio system in the device.

SUMMARY

According to an aspect of the invention, there is provided a method of operation of an audio system, comprising: receiving an input signal; and, if the input signal has a sparse representation in the frequency domain, comprising components at at least one frequency of interest, filtering the input signal in at least one band pass filter, such that only components at the or each frequency of interest are passed to an output.

The method may comprise: analysing the input signal to determine whether the input signal has a sparse representation in the frequency domain.

The method may comprise: analysing the input signal to determine how many significant frequency components are present in the input signal.

The method may comprise: adapting a band pass filter to set a number of pass band frequencies thereof based on the determined number of significant frequency components present in the input signal.

The method may comprise determining whether the input signal has a sparse representation in the frequency domain by passing the input signal to a Linear Predictive Coding block. If so, the method may comprise: determining that the input signal has a sparse representation in the frequency domain if the Linear Predictive Coding block is able to identify one or more frequency component of the input signal, and subtracting the identified one or more frequency component from the input signal produces a result that is below a threshold.

The method may comprise determining whether the input signal has a sparse representation in the frequency domain by: passing the input signal to a Fast Fourier Transform block; and determining a number of significant frequency components in an output of the Fast Fourier Transform block. If so, the method may further comprise: if it is determined that the input signal has a sparse representation in the frequency domain, passing the output signal of the Fast Fourier Transform block to an Inverse Sparse Fourier Transform block to generate an output signal in the time domain comprising only the significant frequency components.

The method may comprise determining whether the input signal has a sparse representation in the frequency domain by: passing the input signal to a series of one or more notch filters, each having a respective notch filter frequency; determining if an output of any notch filter is below a threshold; and determining that the input signal has a sparse representation in the frequency domain if an output of one notch filter is below a threshold. If so, the method may further comprise, if it is determined that the input signal has a sparse representation in the frequency domain: setting a pass band frequency of said at least one band pass filter to be equal to a respective notch filter frequency of a notch filter.

The input signal may be considered to have a sparse representation in the frequency domain if the signal contains fewer than five frequency components at significant levels.

According to an aspect of the invention, there is provided an audio system, comprising: an input for receiving an input signal; an output; and a filter for filtering the input signal in at least one band pass filter, such that only components at at least one frequency of interest are passed to the output if the input signal has a sparse representation in the frequency domain.

The audio system may be configured for analysing the input signal to determine whether the input signal has a sparse representation in the frequency domain.

The audio system may be configured for: analysing the input signal to determine how many significant frequency components are present in the input signal.

The audio system may comprise at least one band pass filter, and be configured for: adapting the band pass filter to set a number of pass band frequencies thereof based on the determined number of significant frequency components present in the input signal.

The audio system may be configured for determining whether the input signal has a sparse representation in the frequency domain by passing the input signal to a Linear Predictive Coding block.

The audio system may be configured for determining that the input signal has a sparse representation in the frequency domain if the Linear Predictive Coding block is able to identify one or more frequency component of the input signal, and subtracting the identified one or more frequency component from the input signal produces a result that is below a threshold.

The audio system may be configured for determining whether the input signal has a sparse representation in the frequency domain by: passing the input signal to a Fast Fourier Transform block; and determining a number of significant frequency components in an output of the Fast Fourier Transform block.

The audio system may be further configured for: if it is determined that the input signal has a sparse representation in the frequency domain, passing the output signal of the Fast Fourier Transform block to an Inverse Sparse Fourier Transform block to generate an output signal in the time domain comprising only the significant frequency components.

The audio system may be configured for determining whether the input signal has a sparse representation in the frequency domain by: passing the input signal to a series of one or more notch filters, each having a respective notch filter frequency; determining if an output of any notch filter is below a threshold; and determining that the input signal has a sparse representation in the frequency domain if an output of one notch filter is below a threshold.

The audio system may be further configured for, if it is determined that the input signal has a sparse representation in the frequency domain: setting a pass band frequency of said at least one band pass filter to be equal to a respective notch filter frequency of a notch filter.

According to a further aspect, there is provided a device comprising a system according to the second aspect.

The device may comprise a mobile telephone, an audio player, a video player, a mobile computing platform, a games device, a remote controller device, a toy, a machine, or a home automation controller or a domestic appliance.

According to a further aspect, there is provided a computer program product, comprising a computer-readable tangible medium, and instructions for performing a method according to the first aspect.

According to a further aspect, there is provided a non-transitory computer readable storage medium having computer-executable instructions stored thereon that, when executed by processor circuitry, cause the processor circuitry to perform a method according to the first aspect.

This has the advantage that the full capabilities of the audio system can be recognised.

BRIEF DESCRIPTION OF DRAWINGS

For a better understanding of the present invention, and to show how it may be put into effect, reference will now be made, by way of example, to the accompanying drawings, in which:—

DETAILED DESCRIPTION OF EMBODIMENTS

Figure 1:
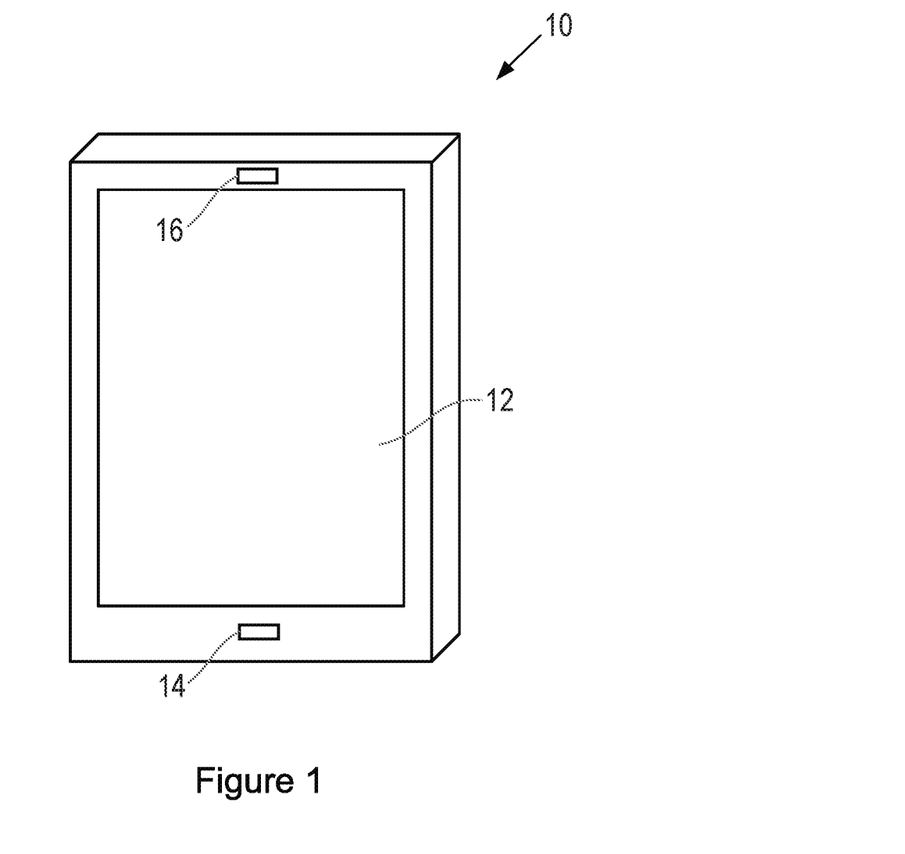
FIG. 1 illustrates a smartphone as an example of an electronic device.

FIG. 1 shows a device in accordance with one aspect of the invention. The device may be any suitable type of device, such as a mobile computing device for example a laptop or tablet computer, a games console, a remote control device, a home automation controller or a domestic appliance including a domestic temperature or lighting control system, a toy, a machine such as a robot, an audio player, a video player, or the like, but in this illustrative example the device is a mobile telephone, and specifically a smartphone 10.

The smartphone 10 includes a screen 12 for displaying information to a user, a sound inlet 14, for allowing sound to be detected by a microphone (not illustrated), and a sound outlet 16 for allowing sound to be output by a speaker (not illustrated). The smartphone may also comprise one or more wired interface connectors (not illustrated), for example USB-C ports or 3.5 mm jack sockets through which digital or analog signals may be input to or output from the smartphone.

Figure 2:
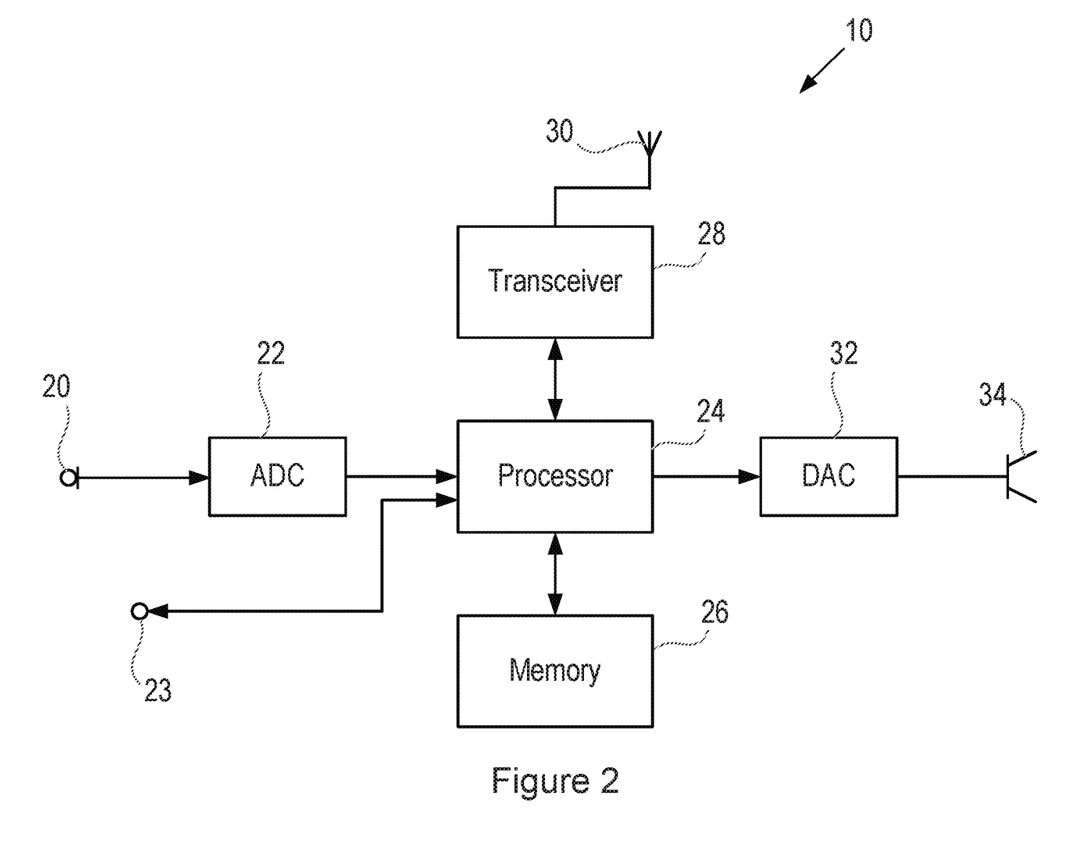
FIG. 2 is a schematic illustration of an electronic device.

FIG. 2 is a schematic diagram showing the smartphone 10. In this example, the smartphone 10 includes a microphone 20, which may for example be located close to the sound inlet 14 shown in FIG. 1. Electronic signals generated by the microphone 20 are passed to an analog-to-digital converter (ADC) 22, which converts analog signals received from the microphone 20 into digital signals.

Digital signals generated by the analog-to-digital converter 22 or received via a wired interface 23, are passed to a processor 24. It will be noted here that, although FIG. 2 shows a single processor 24, in practice the processing performed in a smartphone such as the smartphone 10 may be divided between multiple separate processors, such as an audio digital signal processor (for example integrated on a smart codec integrated circuit), a general purpose processor, an applications processor, a communications processor, and/or a graphics processor.

The processor 24 performs methods as described herein on the basis of data and program instructions stored in a memory 26. Specifically, the methods described herein can be performed on the processor 24 by executing instructions that are stored in non-transient form in the memory 26, with the program instructions being stored either during manufacture of the device 10 or by upload while the device 10 is in use. It will also be noted here that, although FIG. 2 shows a single memory 26, in practice the memory requirements of a smartphone such as the smartphone 10 may be divided between multiple separate storage elements.

The processor 24 is connected to transceiver circuitry 28, which is itself connected to an antenna 30, allowing signals to be transmitted to remote devices and received from remote devices over an external wireless network.

The processor 24 is also connected to a digital-to-analog converter 32, which is in turn connected to a speaker 34. Thus, digital signals generated by the processor 24, or received from the transceiver 28, or retrieved from the memory 26, may be applied to the digital-to-analog converter (DAC) 32, and converted into an analog form, suitable for application to the speaker 34. These digital or analog signals may also be able to be output from one or more wired interfaces 23 (for example a USB-C receptacle or an audio 3.5 mm jack socket).

In some situations, it is desirable to test the operation of the audio circuitry in the device 10. For example, it is useful for the manufacturer of the smartphone 10 to be able to test the operation of the audio circuitry. Also, it is common for third parties to test the audio systems on smartphones, in order to make comparisons between smartphone models.

However, such tests most commonly use an audio system that is provided as part of the operating system of the device. For example, smartphones or other mobile devices using the Android operating system use the AudioFlinger audio system, and output test data from the processor 24 through the DAC 32. The AudioFlinger system operates with 16 bit data at a frequency of 48 kHz, and so it is inherently limited to a theoretical maximum of 96 dB dynamic range, and in practice to less than this (because the largest signal that it can represent is $2^{16}$ times larger than the smallest signal that it can represent, and $2^{16} \approx 96$ dB). However, a smartphone may include a DAC 32 that is of good quality, and that has a dynamic range that is significantly higher than this.

Thus, a test that uses the AudioFlinger audio system would never be able to recognise the full capabilities of the DAC 32 in the device 10.

The tests that are commonly performed involve generating digital data representing a sine wave (or a test signal containing a small number of sinewaves at different frequencies), and outputting that digital data from the processor 24 through the DAC 32.

In examples as described below, the dynamic range of the signal can be advantageously increased by filtering the signal that is passed to the device, so that only the spectral components that are desired in the test signal are passed to the device.

Figure 3:
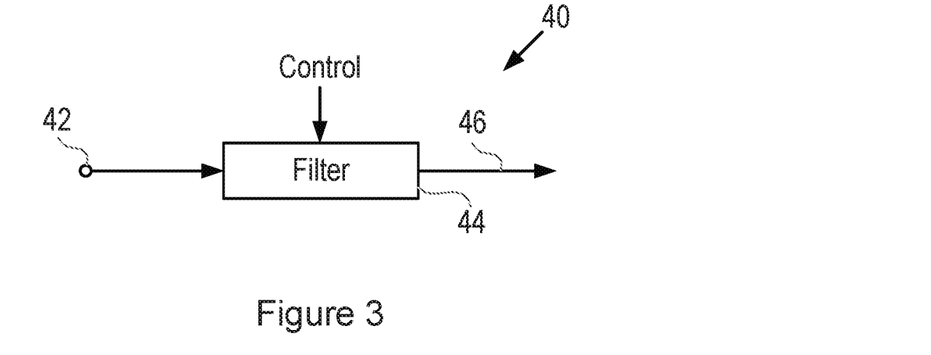
FIG. 3 illustrates an embodiment of the present invention.

FIG. 3 illustrates schematically a first system for achieving this. Specifically, FIG. 3 shows a system 40 for receiving an input signal on an input 42. If the input signal has a sparse representation in the frequency domain, comprising components at at least one frequency of interest, the input signal is passed to a filter block 44, which contains at least one band pass filter, such that components at the or each frequency of interest are passed to an output 46.

A control input to the filter block 44 can be used to select the pass band frequency or frequencies of the band pass filter, if the frequency components that are included in the input signal are known.

In general, the term "sparse", when used herein to describe a signal, is used to mean that the signal contains only a small number of frequency components at significant levels. More specifically, the term "sparse" is used to mean that the signal contains fewer than five frequency components at significant levels.

Figure 4:
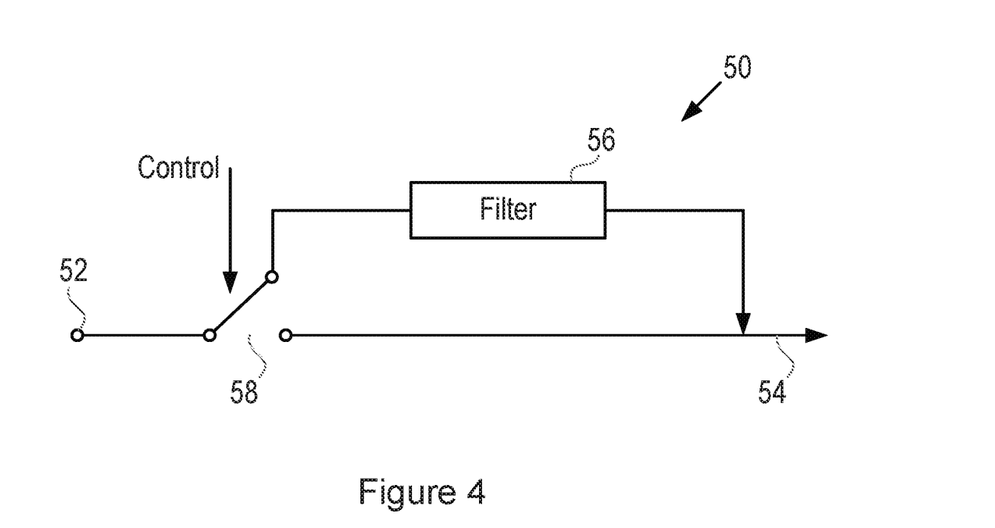
FIG. 4 illustrates an embodiment of the present invention.

FIG. 4 illustrates schematically a second system. Specifically, FIG. 4 shows a system 50 for receiving an input signal on an input 52. The input signal may be passed direct to an output 54 or, if the input signal has a sparse representation in the frequency domain, comprising components at at least one frequency of interest, the input signal may be passed to a filter block 56, which contains at least one band pass filter, such that components at the or each frequency of interest are passed to the output 54.

A control input controls a switch 58, which determines whether the input signal is passed direct to the output 54 or through the filter block 56.

The systems shown in FIGS. 3 and 4 can in effect be combined, with a first control signal being used to pass an input signal to a bandpass filter if it is known that the input signal is sparse, and a second control signal being used to select the pass band frequency or frequencies of the band pass filter, if the frequency components that are included in the input signal are known.

Figure 5:
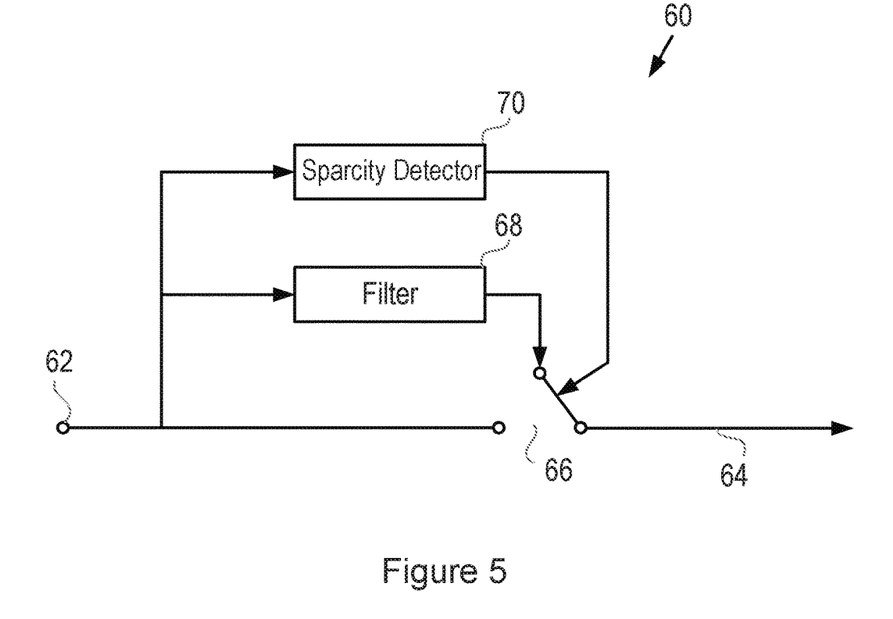
FIG. 5 illustrates an embodiment of the present invention.

FIG. 5 illustrates schematically a third system, for use when it is not known in advance when a specific known test signal will be applied. Specifically, FIG. 5 shows a system 60 for receiving an input signal on an input 62. The input signal is passed to an output 64 through a first input terminal of a switch 66.

The input signal is also passed to a filter block 68, which contains at least one band pass filter, and the output of the filter block 68 is connected to the output 64 through a second input terminal of the switch 66.

The input signal is also passed to a sparsity detector 70, which determines whether the input signal has a sparse representation in the frequency domain. An output signal from the sparsity detector 70, based on this determination, is used to control the switch 66. When the input signal is determined to be sparse, the output of the filter block 68 is connected to the output 64. When the input signal is determined not to be sparse, the input signal is passed to the output 64.

FIG. 5 therefore illustrates schematically a system for detecting when an input signal contains only a small number of different frequency components. When the input signal is, for example, music or speech, it will contain significant components at a large number of frequencies. However, when the input signal is a typical test signal, containing only a small number of sinewaves at different frequencies, it will contain significant components only at these frequencies of the sinewaves.

Figure 6:
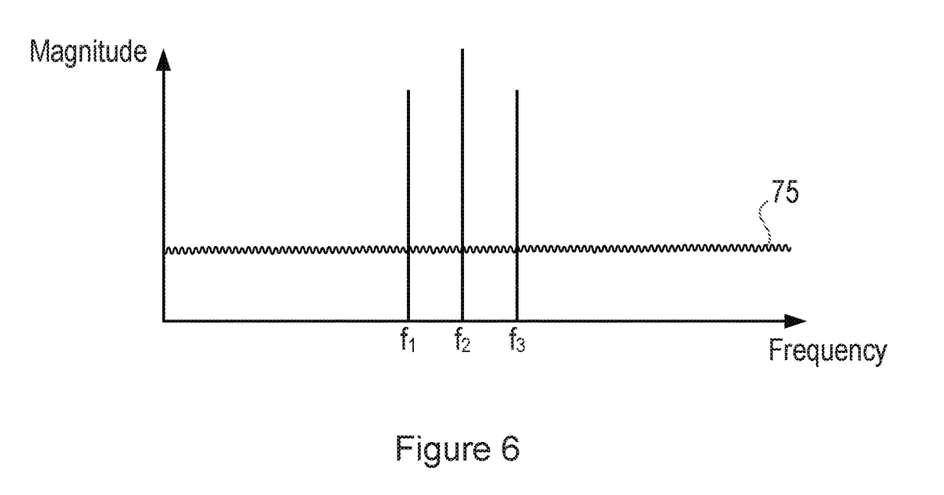
FIG. 6 illustrates properties of a signal in system of the present invention.

FIG. 6 illustrates the form of the input signal in the frequency domain in this case. For most frequencies, the magnitude of the signal is below the level of the noise floor 75. However, there are significant signal magnitudes at three frequencies $f_1$, $f_2$ and $f_3$.

Thus, the sparsity detector 70 can determine that there are only three frequencies at which the input signal has a significant magnitude, and hence that the input signal has a sparse representation in the frequency domain. An output signal from the sparsity detector 70, based on this determination, is used to control the switch 66, so that the filtered signal is passed to the output. Further, if it is not known in advance which frequencies will be applied to the input signal, a control signal from the sparsity detector 70 can be passed to the filter block 68 to control the pass band frequencies of the band pass filter or filters therein. Specifically, in the example shown in FIG. 6, the band pass filter or filters in the filter block 68 can be set so that they pass the frequency components at the frequencies $f_1$, $f_2$ and $f_3$. In general, the number of band pass filters in the filter block 68 should be such that it matches the maximum number of frequency components that can be present for the signal to be considered sparse in any particular application. Thus, if only signals with two or fewer significant frequency components are considered sparse, then the filter block 68 may contain two band pass filters. If signals containing four significant frequency components are considered sparse, then the filter block 68 may contain four band pass filters.

Thus, the effect of the system shown in FIG. 5 is that all of the significant frequency components are passed through a respective bandpass filter block in the filter block 68, but that other components are filtered out. Thus, this has no audible effect on the output signal, but the dynamic range of the output signal is increased.

This means that the dynamic range of the signal is increased, and so the effect of using a high quality DAC will be detectable.

The signal as received by the system of FIG. 5 may have been generated or passed through the Android Audio Flinger audio system or suchlike, and/or may be of an inherently limited dynamic range due to say a 16-bit 48 kHz digital format employed. The output of the digital filter is not constrained to such a format, and may thus be over a higher sample rate or a higher bit resolution and thus be able to deliver a higher dynamic range digital signal to a downstream DAC.

The analog output of the DAC may then be monitored via say an analog output connector or jack socket of the host device.

In one embodiment, this operation of the system is enabled, for example manually, when it is known that the device is being tested. FIG. 4 shows a control signal being applied to the switch 58. Thus, when it is known that the device is being tested, a manually controlled enable signal can be generated.

When it is known that the test signal will be a sinewave at a single frequency that is not known in advance, the form of the filter block in FIG. 3, FIG. 4 or FIG. 5 can be a band pass filter with an adaptive pass band.

Figure 7:
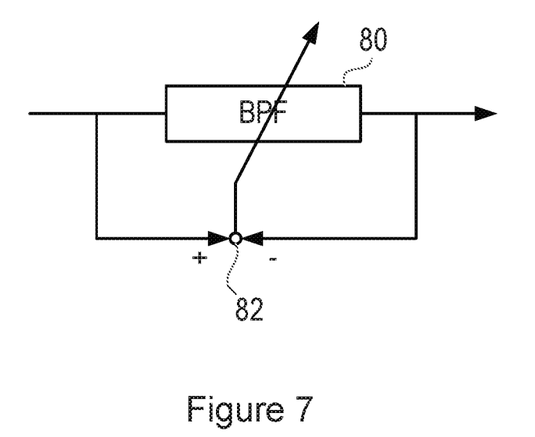
FIG. 7 illustrates an embodiment of the present invention.

FIG. 7 shows a suitable filter of this form.

Specifically, FIG. 7 shows an input signal being applied to an adaptive band pass filter 80, which allows only signals in its pass band to pass through the filter. The input signal is also applied to a first input of a subtractor 82. The filter output is applied to a second input of the subtractor 82.

If the input signal contains only a single frequency component, and the pass band of the adaptive band pass filter 80 matches this exactly, then the error signal output from the subtractor 82 is zero. If the output of the subtractor 82 is non-zero, then the error signal can be used to adapt the pass band of the filter 80 until such time as the pass band is set to the correct frequency.

When it is known that the test signal will contain sinewaves at multiple frequencies that are not known in advance, the filter block shown in FIG. 7 can instead include multiple bandpass filters in parallel, and the pass band frequencies of these filters can be adapted so that they match the frequencies of the test signal components.

Figure 8:
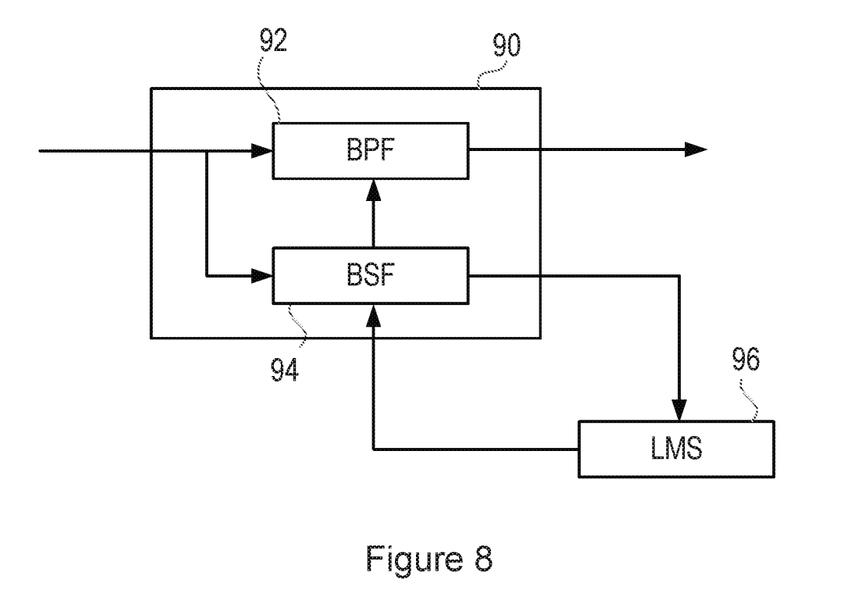
FIG. 8 illustrates an embodiment of the present invention.

FIG. 8 shows a second suitable filter of this form.

Specifically, FIG. 8 shows an input signal being applied to a filter block 90, which contains an adaptive band pass filter (BPF) 92 and an adaptive band stop filter (BSF) 94. The output of the band stop filter 94 is passed to a least mean squares (LMS) algorithm block 96, and the output of the LMS block 96 is fed back to the band stop filter 94, in order to adapt the stop band frequency thereof, so that the signal passing to the LMS block 96 is minimised. This occurs when the stop band frequency of the band stop filter 94 matches the single frequency component of the input signal.

The adaptive band pass filter 92 and the adaptive band stop filter 94 are in communication so that the adaptive band pass filter 92 can be adapted so that its pass band frequency matches the stop band frequency of the adaptive band stop filter 94. This therefore acts that only the single frequency component of the input signal is passed by the adaptive band pass filter 92.

As in FIG. 7, if it is known that the test signal will contain sinewaves at multiple frequencies that are not known in advance, the filter block shown in FIG. 8 can instead include multiple bandpass filters in parallel, with corresponding band stop filters, and the pass band frequencies of these adaptive bandpass filters can be adapted so that they match the frequencies of the test signal components.

Figure 9:
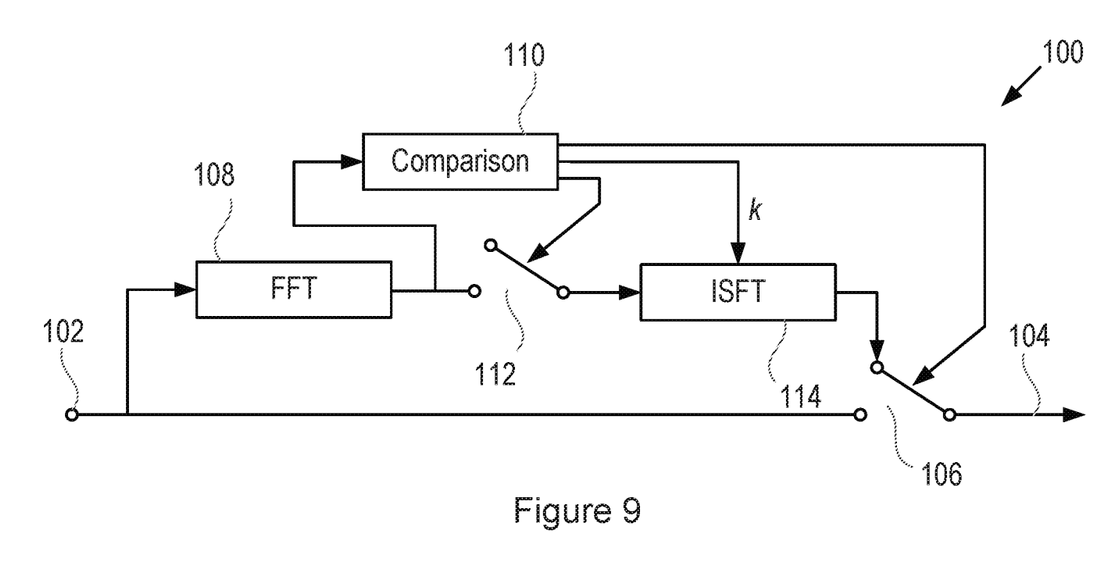
FIG. 9 illustrates an embodiment of the present invention.

FIG. 9 illustrates schematically an embodiment of a system which determines whether the signal is sparse, and, if so, filters the signal. Specifically, FIG. 9 shows a system 100 for receiving an input signal on an input 102. The input signal is passed to an output 104 through a first input terminal of a first switch 106.

The input signal is also passed to a Fast Fourier Transform (FFT) block 108, which resolves the signal into the frequency domain. That is, it determines the magnitude of the signal in each of a large number of frequency bins. In this example, the frequency bins may cover some or all of the audio frequency band (for example, taken to be 20 Hz-20 kHz), or may cover a frequency range within which any test signals are expected to lie.

The output of the FFT block 108 is then passed to a comparison block 110, which compares each of the magnitudes calculated by the FFT block 108 for the respective frequency bins with a threshold value. The threshold value may be set so that any significant level or magnitude, for example any magnitude that exceeds the level of the noise floor and/or is less than a defined amount below the total signal magnitude or the magnitude of the largest component, will exceed the threshold value. If this comparison identifies that there is only a small number of frequencies, for example less than five, for which the input signal contains components at a significant level, then it is determined that the signal is sparse.

Further, the comparison block 110 can identify the specific frequencies, at which the input signal contains components at a significant level.

In some examples, the number of significant components and values of the respective frequencies may be derived using a known "divide and conquer" iterative approach, for example in association with a Goertzel algorithm, rather than calculating the magnitude of all possible signal frequency components, to reduce the computational effort required.

The comparison block 110 therefore generates three control signals. A first control signal is applied to a second switch 112. When it is determined that the input signal is sparse, the first control signal closes the second switch 112, such that the output of the FFT block 108 is passed to an Inverse Sparse Fourier Transform block 114. A second control signal is applied to the Inverse Sparse Fourier Transform block 114, and identifies the k frequencies for which the input signal contains components at a significant level. A third control signal is applied to the first switch 106, such that the output of the Inverse Sparse Fourier Transform block 114 is passed to the output 104. When it is determined that the input signal is not sparse, the first switch 106 is controlled such that the input signal is passed to the output 104.

Alternatively, the output of the FFT block 108 is passed to an Inverse Fast Fourier Transform (IFFT) block.

The Inverse Sparse Fourier Transform block 114 acts in a similar way to a conventional Inverse Fast Fourier Transform (IFFT) block, reconstructing a signal in the time domain from the frequency domain signal generated by the FFT block. However, by contrast with an IFFT block, the Inverse Sparse Fourier Transform block 114 constructs an output time domain signal using only those k frequency components of the frequency domain signal generated by the FFT block that are identified by the second control signal.

Thus, when the input signal is determined to be sparse, the signal that is passed to the output 104 contains only those k frequency components. All other frequency components have effectively been filtered out of the input signal.

Figure 10:
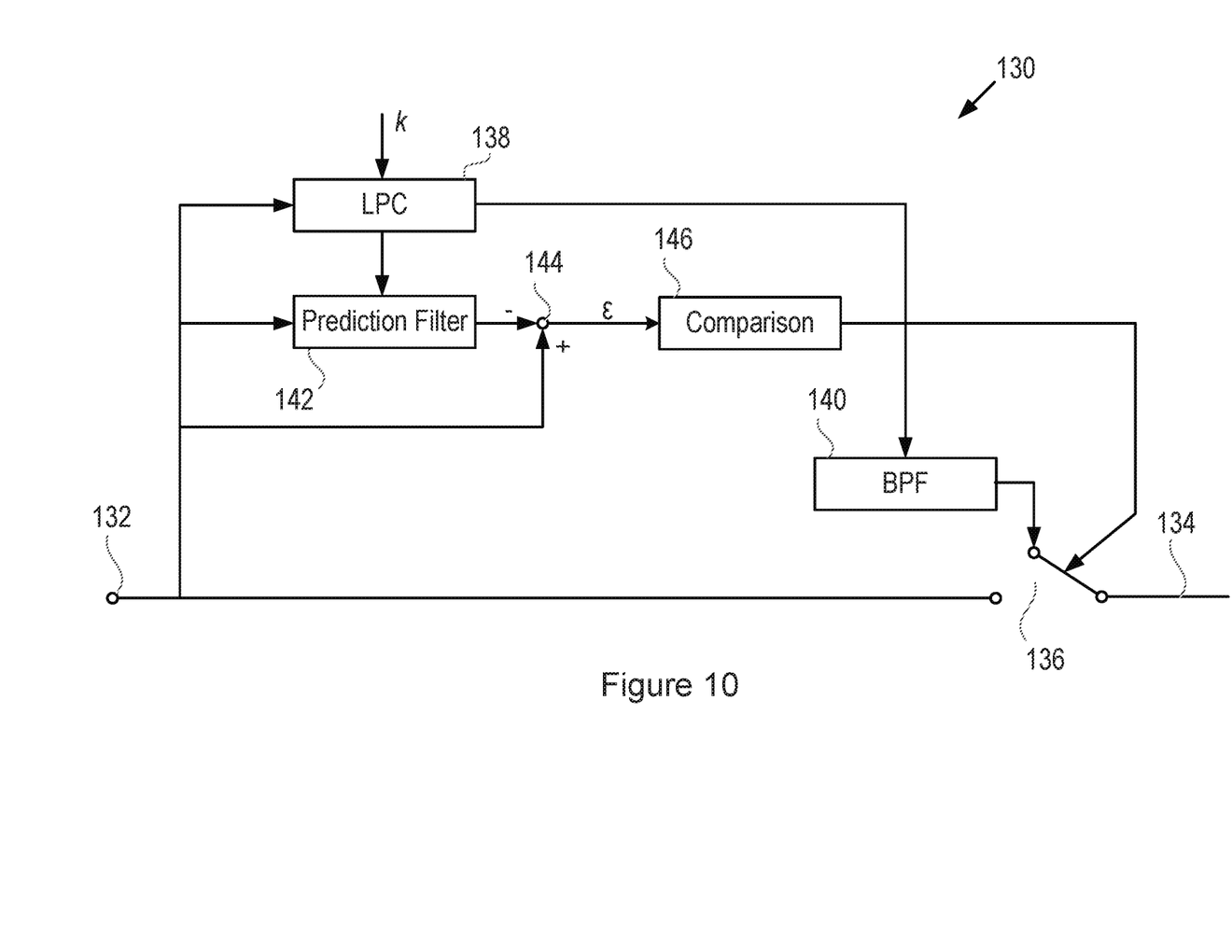
FIG. 10 illustrates an embodiment of the present invention.

FIG. 10 illustrates schematically a further embodiment of a system which determines whether the signal is sparse, and, if so, filters the signal. Specifically, FIG. 10 shows a system 130 for receiving an input signal on an input 132. The input signal is passed to an output 134 through a first input terminal of a first switch 136.

The input signal is also passed to a Linear Predictive Coding (LPC) block 138, for example operating using the Levinson-Durbin iteration algorithm. This receives an input k, and identifies the k most significant frequency components of the input signal. The input k can be set to the expected number of frequency components in an input test signal.

These frequency components identified by the LPC block 138 are then used to set suitable coefficients in a band pass filter block 140, which receives the input signal as its input, and the output of which is connected to a second input terminal of the first switch 136.

The frequency components identified by the LPC block 138 are also used to set the k pass band frequencies of a prediction filter 142, which also receives the input signal as its input. The output of the prediction filter is passed to a subtractor 144, where it is subtracted from the input signal. The resulting error signal E is a measure of the difference between the input signal and the output of the prediction filter 142.

The error signal E is passed to a comparison block 146, where it is compared with a threshold value. The comparison block 146 generates a control signal, which controls the first switch 136.

If the input signal does indeed contain k frequency components, for example because it is a test signal of the expected form, then the k frequency components can be identified by the LPC block 138, and can be used to set suitable coefficients in the band pass filter block 140, so that only these frequency components are passed by the band pass filter block 140.

The frequency components identified by the LPC block 138 can also be used to accurately set the k pass band frequencies of the prediction filter 142, so that the error signal E, the measure of the difference between the input signal and the output of the prediction filter 142, is small.

The error signal E will therefore be below the threshold value, and the comparison block 146 can generate a control signal, which controls the first switch 136 so that the output of the band pass filter block 140 is sent to the output 134.

By contrast, if the input signal does not contain exactly k frequency components, for example because it is a music or speech signal containing a wide range of frequencies, then the LPC block 138 will be unable to set k pass band frequencies of the prediction filter 142 so that the error signal E is small.

The error signal ε will therefore be above the threshold value, and the comparison block 146 can generate a control signal, which controls the first switch 136 so that the input signal is sent to the output 134.

If the number of frequency components in a test signal is not known in advance, then multiple blocks 130 can be provided, each operating with a different value of k, or the value of k can be altered until a value is found that causes an error signal ε below the threshold value to be generated.

Figure 11:
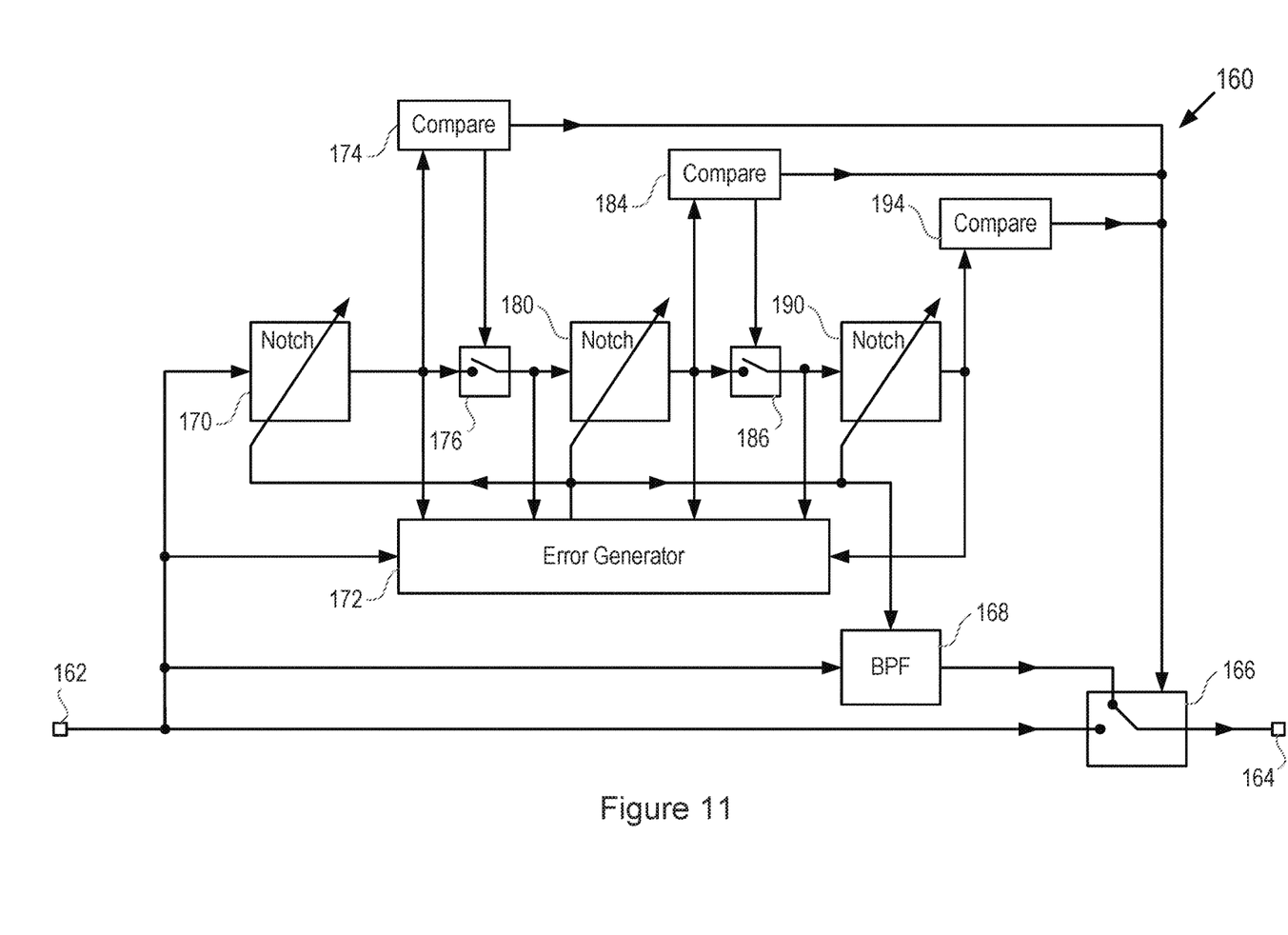
FIG. 11 illustrates an embodiment of the present invention.

FIG. 11 illustrates schematically a further embodiment of a system which determines whether the signal is sparse, and, if so, filters the signal. Specifically, FIG. 11 shows a system 160 for receiving an input signal on an input 162. The input signal is passed to an output 164 through a first input terminal of a first switch 166.

The input signal is also passed to a band pass filter block 168, the output of which is connected to a second input terminal of the first switch 166.

In this example embodiment, the system 160 is able to identify that the input signal is sparse if it contains either 1, 2 or 3 significant frequency components. If it is desired to recognise signals that have either a higher or a lower maximum number of frequency components, the system can be modified accordingly.

The input signal is also passed to a first adaptive notch filter block 170, which acts to filter out one frequency of its input signal, referred to herein as the notch filter frequency of the notch filter block. The input and the output of the first adaptive notch filter block 170 are connected to respective input terminals of an error generator block 172, which calculates the difference between the input and the output of the first adaptive notch filter block 170, and this is used to control the notch frequency of the first adaptive notch filter block 170 in order to tune the notch frequency so that the most significant frequency component of the input signal is removed by the first adaptive notch filter block 170.

The output of the first adaptive notch filter block 170 is passed to a first comparison block 174. The first comparison block 174 determines if the output of the first adaptive notch filter block 170 is considered to be below a threshold magnitude.

If so, then it is considered that the input signal contains only one significant frequency component (i.e. that the input signal is 1-sparse), and that frequency component has been filtered out by the first adaptive notch filter block 170.

The notch filter frequency of the first adaptive notch filter block 170 is therefore used to set a corresponding pass band frequency in the band pass filter 168, and the first comparison block 174 sends a control signal to the first switch 166 so that the output of the band pass filter 168 is passed to the output 164.

If the first comparison block 174 determines that the output of the first adaptive notch filter block 170 is below a threshold magnitude, then a second switch 176 is opened. Otherwise, the second switch 176 is closed, and the output of the first adaptive notch filter block 170 is passed to a second adaptive notch filter block 180, which acts to filter out one frequency of its input signal. The input and the output of the second adaptive notch filter block 180 are connected to respective input terminals of the error generator block 172, which calculates the difference between the input and the output of the second adaptive notch filter block 180, and this is used to control the notch frequency of the second adaptive notch filter block 180 in order to tune the notch frequency so that the second adaptive notch filter block 180 removes the most significant frequency component of its input signal.

This most significant frequency component of the input signal of the second adaptive notch filter block 180 is the second most significant frequency component of the input signal.

The output of the second adaptive notch filter block 180 is passed to a second comparison block 184. The second comparison block 184 determines if the output of the second adaptive notch filter block 180 is considered to be below a threshold magnitude.

If so, then it is considered that the input signal contains only two significant frequency components (i.e. that the input signal is 2-sparse), and that the input signal of the second adaptive notch filter block 180 contains only one significant frequency component, and that has been filtered out by the second adaptive notch filter block 180.

The notch filter frequency of the second adaptive notch filter block 180 is therefore used to set a corresponding pass band frequency in the band pass filter 168, and the second comparison block 184 sends a control signal to the first switch 166 so that the output of the band pass filter 168 is passed to the output 164.

If the second comparison block 184 determines that the output of the second adaptive notch filter block 180 is below a threshold magnitude, then a third switch 186 is opened.

Otherwise, the third switch 186 is closed, and the output of the second adaptive notch filter block 180 is passed to a third adaptive notch filter block 190, which acts to filter out one frequency of its input signal. The input and the output of the third adaptive notch filter block 190 are connected to respective input terminals of the error generator block 172, which calculates the difference between the input and the output of the third adaptive notch filter block 190, and this is used to control the notch frequency of the third adaptive notch filter block 190 in order to tune the notch frequency so that the third adaptive notch filter block 190 removes the most significant frequency component of its input signal.

This most significant frequency component of the input signal of the third adaptive notch filter block 190 is the third most significant frequency component of the input signal.

The output of the third adaptive notch filter block 190 is passed to a third comparison block 194. The third comparison block 194 determines if the output of the third adaptive notch filter block 190 is considered to be below a threshold magnitude.

If so, then it is considered that the input signal contains only three significant frequency components (i.e. that the input signal is 3-sparse), and that the input signal of the third adaptive notch filter block 190 contains only one significant frequency component, and that has been filtered out by the third adaptive notch filter block 190.

The notch filter frequency of the third adaptive notch filter block 190 is therefore used to set a corresponding pass band frequency in the band pass filter 168, and the third comparison block 194 sends a control signal to the first switch 166 so that the output of the band pass filter 168 is passed to the output 164.

Thus, if any of the comparison blocks 174, 184, 194 generate a signal indicating that all of the frequency components of the input signal have been filtered out, then it is considered that the input signal is sparse, and the notch frequency or frequencies of the notch filter(s) 170, 180, 190 are used to set corresponding pass band frequencies in the band pass filter 168, and it is this filtered signal that is passed to the output.

If none of the comparison blocks 174, 184, 194 generate a signal indicating that all of the frequency components of the input signal have been filtered out, then it is considered that the input signal is not sparse, and it is the unfiltered signal that is passed to the output.

It should be noted that, although this describes the notch frequencies of the notch filters 170, 180, 190 being determined independently, in some embodiments the adaptation processes may be interlinked, i.e. a joint adaptation process may be used to set the notch frequencies.

There are therefore described methods and systems for handling test signals. When it is known that an input signal is a test signal, then the test mode can be initiated manually, with the filtering being applied to the input signal. When it is not known whether the input signal is a test signal, then the input signal can be tested, with the test mode being initiated manually, and filtering being applied to the input signal, when it is determined that the input signal is sparse.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An audio system, comprising:
    an input for receiving an input signal;
    an output;
    a sparsity detector for determining whether the input signal has a sparse representation in the frequency domain;
    a switch, wherein the switch is controlled by an output signal from the sparsity detector based on a determination whether the input signal has a sparse representation in the frequency domain; and
    a filter for filtering the input signal in at least one band pass filter,
    wherein, if the input signal is determined to have a sparse representation in the frequency domain, the switch is controlled such that the output of the filter is passed to the output and therefore only components at at least one frequency of interest are passed to the output, and if the input signal is determined not to have a sparse representation in the frequency domain, the switch is controlled such that the input signal is passed to the output.

2. An audio system as claimed in claim 1, configured for analysing the input signal to determine whether the input signal has a sparse representation in the frequency domain.

3. An audio system as claimed in claim 2, configured for determining whether the input signal has a sparse representation in the frequency domain by passing the input signal to a Linear Predictive Coding block.

4. An audio system as claimed in claim 3, configured for determining that the input signal has a sparse representation in the frequency domain if the Linear Predictive Coding block is able to identify one or more frequency component of the input signal, and subtracting the identified one or more frequency component from the input signal produces a result that is below a threshold.

5. An audio system as claimed in claim 2, configured for determining whether the input signal has a sparse representation in the frequency domain by:
passing the input signal to a Fast Fourier Transform block; and
determining a number of significant frequency components in an output of the Fast Fourier Transform block.

6. An audio system as claimed in claim 5, further configured for:
if it is determined that the input signal has a sparse representation in the frequency domain, passing the output signal of the Fast Fourier Transform block to an Inverse Sparse Fourier Transform block to generate an output signal in the time domain comprising only the significant frequency components.

7. An audio system as claimed in claim 2, configured for determining whether the input signal has a sparse representation in the frequency domain by:
passing the input signal to a series of one or more notch filters, each having a respective notch filter frequency;
determining if an output of any notch filter is below a threshold; and
determining that the input signal has a sparse representation in the frequency domain if an output of one notch filter is below a threshold.

8. An audio system as claimed in claim 7, further configured for, if it is determined that the input signal has a sparse representation in the frequency domain:
setting a pass band frequency of said at least one band pass filter to be equal to a respective notch filter frequency of a notch filter.

9. An audio system as claimed in claim 1, configured for:
analysing the input signal to determine how many significant frequency components are present in the input signal.

10. An audio system as claimed in claim 9, comprising at least one band pass filter, and configured for:
adapting the band pass filter to set a number of pass band frequencies thereof based on the determined number of significant frequency components present in the input signal.

11. A device comprising a system as claimed in claim 1, wherein the device comprises a mobile telephone, an audio player, a video player, a mobile computing platform, a games device, a remote controller device, a toy, a machine, or a home automation controller or a domestic appliance.

12. A method of operation of an audio system, comprising:
receiving an input signal;
determining by means of a processing element whether the input signal has a sparse representation in the frequency domain, comprising components at at least one frequency of interest;
if the input signal is determined to have a sparse representation in the frequency domain, filtering the input signal in at least one band pass filter, such that only components at the or each frequency of interest are passed to an output; and
if the input signal is determined not to have a sparse representation in the frequency domain, passing the input signal to the output.

13. A method as claimed in claim 12, comprising:
analysing the input signal to determine whether the input signal has a sparse representation in the frequency domain.

14. A method as claimed in claim 12, comprising:
analysing the input signal to determine how many significant frequency components are present in the input signal.

15. A method as claimed in claim 14, comprising:
adapting a band pass filter to set a number of pass band frequencies thereof based on the determined number of significant frequency components present in the input signal.

16. A method as claimed in claim 12, comprising determining whether the input signal has a sparse representation in the frequency domain by passing the input signal to a Linear Predictive Coding block, and further comprising:
determining that the input signal has a sparse representation in the frequency domain if the Linear Predictive Coding block is able to identify one or more frequency component of the input signal, and subtracting the identified one or more frequency component from the input signal produces a result that is below a threshold.

17. A method as claimed in claim 12, comprising determining whether the input signal has a sparse representation in the frequency domain by:
passing the input signal to a Fast Fourier Transform block; and
determining a number of significant frequency components in an output of the Fast Fourier Transform block, and further comprising:
if it is determined that the input signal has a sparse representation in the frequency domain, passing the output signal of the Fast Fourier Transform block to an Inverse Sparse Fourier Transform block to generate an output signal in the time domain comprising only the significant frequency components.

18. A method as claimed in claim 12, comprising determining whether the input signal has a sparse representation in the frequency domain by:
passing the input signal to a series of one or more notch filters, each having a respective notch filter frequency;
determining if an output of any notch filter is below a threshold; and
determining that the input signal has a sparse representation in the frequency domain if an output of one notch filter is below a threshold, and further comprising, if it is determined that the input signal has a sparse representation in the frequency domain:
setting a pass band frequency of said at least one band pass filter to be equal to a respective notch filter frequency of a notch filter.

19. A method as claimed in claim 12, wherein the input signal is considered to have a sparse representation in the frequency domain if the signal contains fewer than five frequency components at significant levels.

20. A non-transitory computer readable storage medium having computer-executable instructions stored thereon that, when executed by processor circuitry, cause the processor circuitry to perform a method according to claim 12.

* * * * *

UNITED STATES PATENT AND TRADEMARK OFFICE
CERTIFICATE OF CORRECTION

PATENT NO. : 10,375,493 B2
APPLICATION NO. : 16/009638
DATED : August 6, 2019
INVENTOR(S) : Lesso et al.

Page 1 of 1

It is certified that error appears in the above-identified patent and that said Letters Patent is hereby corrected as shown below:

In the Specification

1. In Column 9, Line 6, delete "signal E" and insert -- signal ε --, therefor.

2. In Column 9, Line 9, delete "signal E" and insert -- signal ε --, therefor.

3. In Column 9, Line 23, delete "signal E," and insert -- signal ε, --, therefor.

4. In Column 9, Line 25, delete "signal E" and insert -- signal ε --, therefor.

5. In Column 9, Line 34, delete "signal E" and insert -- signal ε --, therefor.

Signed and Sealed this
Twenty-fourth Day of December, 2019

Andrei Iancu
*Director of the United States Patent and Trademark Office*